United States Patent [19]

Jin et al.

[11] Patent Number: 5,011,823
[45] Date of Patent: Apr. 30, 1991

[54] FABRICATION OF OXIDE SUPERCONDUCTORS BY MELT GROWTH METHOD

[75] Inventors: Sungho Jin, Millington; Richard C. Sherwood, New Providence; Thomas H. Tiefel, Piscataway, all of N.J.

[73] Assignee: AT&T Bell Laboratories, Murray Hill, N.J.

[21] Appl. No.: 126,083

[22] Filed: Nov. 27, 1987

Related U.S. Application Data

[63] Continuation-in-part of Ser. No. 62,529, Jun. 12, 1987, abandoned.

[51] Int. Cl.⁵ .............................................. B05D 5/12
[52] U.S. Cl. ...................................... 505/1; 505/733; 505/740; 427/62; 427/376.2; 427/376.4; 29/599; 252/521; 252/518
[58] Field of Search ............. 427/62, 63, 376.2, 376.4; 505/1, 733, 740; 264/61, 63, 211.11; 252/518, 521; 29/599; 501/152; 423/263, 636

[56] References Cited

U.S. PATENT DOCUMENTS 4,826,808  5/1989  Yurek et al. ........................ 505/1

FOREIGN PATENT DOCUMENTS 0283024  3/1988  European Pat. Off.
0285960  3/1988  European Pat. Off.

OTHER PUBLICATIONS

Matsuzaki et al, "Preparation of a High Tc Superconductor by Oxidization of an Amorphous $La_{1.8}Sr_{0.2}Cu$ Alloy Ribbon in Air", Jpn. J. Appl. Phys., vol. 26 (4), Apr., 1987, L334-336.
Koinuma et al, "Some Problems in the Preparation of Superconducting Oxide Films on Ceramic Substrates", Jpn. J. Appl. Phys., vol. 26(5), May, 1987, L763-765.
"Preparation of Single Crystals of the Superconductor", $Ba_2YCu_3O_{6.5+x}$, by A. Ono and T. Tanaka, *Japanese Journal of Applied Physics*, (1987), May, No. 5, Part 2, Tokyo, Japan, pp. L825-L827.
"Preparation of a High $T_c$ Superconductor by Oxidization of an Amourphous $La_{1.8}Sr_{0.2}Cu$ Alloy Ribbon in Air", by K. Matsuzaki, *Japanese Journal of Applied Physics*, vol. 26, No. 4, Apr. 1987, pp. L334-L336.
"Melt-Processible Rare Earth-Ba-Cu-O Superconductors Based on Molten Ba-Cu Oxides", by A. M. Hermann et al., *Applied Physics Letters*, Nov. 30, 1987, No. 22, New York, N.Y., pp. 1854-1856.
European Search Report, 2 pages.
*Zeitschr. f. Physik B-Condensed Matter*, vol. 64, 189 (1986), "Possible High $T_c$ Superconductivity in the Ba-La-Cu-O Systme", by J. G. Bednorz et al.
*Physical Review Letters*, vol. 58, No. 9, Mar. 2, 1987, pp. 908-910, "Superconductivity at 93K in a New Mixed--Phase Y-Ba-Cu-O Compound System at Ambient Pressure", by M. K. Wu et al.
Physical Review Letters, vol. 58, No. 9, Mar. 2, 1987, pp. 911-912, "High-Pressure Study of the New Y-Ba--Cu-O Superconducting Compound System", by P. H. Hor et al.
*Physical Review Letters*, vol. 58, No. 16, Apr. 20, 1987, pp. 1676-1679, "Bulk Superconductivity at 91K in Single-Phase Oxygen-Deficient Perovskite $Ba_2YCu_3O_{9-\delta}$", by R. J. Cava et al.
*Physical Review Letters*, vol. 58(18), pp. 1888-1890 (1987), "New Superconducting Cuprate Perovskites", by D. W. Murphy et al.
*Communications of the American Ceramic Society*, Apr. 1987, (14 pages), "Phase Compatibilities in the System", "$Y_2O_3$-BaO-CuO at 950° C.", by K. G. Frase et al.

Primary Examiner—Norman Morgenstern
Assistant Examiner—Roy V. King
Attorney, Agent, or Firm—E. E. Pacher

[57] ABSTRACT

Superconductive oxide bodies such as wires, ribbons, rods, and other bulk bodies can be fabricated by a process that comprises melting precursor material, cooling at least of the melt such that a solid body of a desired shape results, and heat treating the solid body in an oxygen-containing atmosphere. The precursor material exemplarily is in the form of pressed superconductive oxide powder. The re-solidified superconductive material is relatively dense, typically textured, with relatively large grain size, and has improved properties, e.g., higher critical current density. An exemplary technique for melting of the precursor material is zone melting.

18 Claims, 6 Drawing Sheets

40 μm

10 μm 2 mm

40 μm

FABRICATION OF OXIDE SUPERCONDUCTORS BY MELT GROWTH METHOD

CROSS REFERENCE TO RELATED APPLICATION

This application is a continuation-in-part of U.S. patent application Ser. No. 062,529, filed Jun. 12, 1987 now abandoned.

FIELD OF THE INVENTION

This invention pertains to methods for producing superconductive bodies, and to apparatus and systems comprising a superconductive body produced by such a method.

BACKGROUND OF THE INVENTION

From the discovery of superconductivity in 1911 to the recent past, essentially all known superconducting materials were elemental metals (e.g., Hg, the first known superconductor) or metal alloys or intermetallic compounds (e.g., $Nb_3Ge$, probably the material with the highest transition temperature $T_c$ known prior to 1986).

Recently, superconductivity was discovered in a new class of materials, namely, metal oxides. See, for instance, J. G. Bednorz and K. A. Muller, *Zeitschr. f. Physik B-Condensed Matter*, Vol. 64, 189 (1986), which reports superconductivity in lanthanum barium copper oxide.

The above report stimulated worldwide research activity, which very quickly resulted in further significant progress. The progress has resulted, inter alia, to date in the discovery that compositions in the Y-Ba-Cu-O system can have superconductive transition temperatures $T_c$ above 77K, the boiling temperature of liquid $N_2$ (see, for instance, M. K. Wu et al, *Physical Review Letters*, Vol. 58, Mar. 2, 1987, page 908; and P. H. Hor et al, ibid, page 911). Furthermore, it has resulted in the identification of the material phase that is responsible for the observed high temperature superconductivity, and in the discovery of composition and processing techniques that result in the formation of bulk samples of material that can be substantially single phase material and can have $T_c$ above 90K (see, for instance, R. J. Cava et al, *Physical Review Letters*, Vol. 58(16), pp. 1676–1679), incorporated herein by reference.

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be one of the most advantageous cryogenic refrigerants, and attainment of superconductivity at or above liquid nitrogen temperature was a long-sought goal which until very recently appeared almost unreachable.

Although this goal has now been attained, there still exist barriers that have to be overcome before the new "ceramic" superconductors can be effectively utilized in technological applications. In particular, the ceramic high $T_c$ superconductive materials are relatively brittle. Development of techniques for fabricating the brittle compounds into bodies of desirable size and shape (e.g., wires or tape), and of techniques for improving the strength and/or other mechanical properties of ceramic superconductive bodies, is an urgent task for the technical community. Furthermore, techniques for increasing the critical current density $J_c$ of bodies formed from superconductive compounds are also of great significance.

For a general overview of some potential applications of superconductors see, for instance, B. B. Schwartz and S. Foner, editors, Superconductor Applications: SQUIDS and MACHINES, Plenum Press 1977; and S. Foner and B. B. Schwartz, editors, Superconductor Material Science, Metallurgy, Fabrications, and Applications, Plenum Press 1981. Among the applications are power transmission lines, rotating machinery, and superconductive magnets for, e.g., fusion generators, MHD generators, particle accelerators, levitated vehicles, magnetic separation, and energy storage, as well as junction devices and detectors. It is expected that many of the above and other applications of superconductivity would materially benefit if high $T_c$ superconductive material could be used instead of the previously considered relatively low $T_c$ materials.

The art has followed three approaches in producing ceramic superconductive compound bodies. One approach comprises providing the desired compound in powder form, producing a bulk body from the powder by any appropriate technique (e.g., cold or hot pressing in or through a die of desired size and shape, or forming a slurry and producing a tape therefrom by the doctor blade technique) and heat treating the resulting body. See U.S. patent application Ser. No. 368,079, which is a continuation of Ser. No. 036,168, filed Apr. 6, 1987 for E. M. Gyorgy et al, titled "Apparatus Comprising a Ceramic Superconductive Body, and Method for Producing Such a Body now abandoned." The heat treatment invariably comprises treatment at a relatively high temperature that is intended to produce sintering of the powder particles, followed typically by optimization of the oxygen content of the material. The thus produced superconductive bodies typically are relatively porous (e.g., about 85% dense, depending on processing conditions). Furthermore, powder particles may not always be in intimate contact with their neighbors. The presence of voids and/or poor contact between particles is thought to be a possible reason for the relatively low strength and critical current of bodies produced from superconductive oxide powder by ceramic processing techniques.

A recently filed U.S. patent application Ser. No. 426,485, which is a continuation of application Ser. No. 046,825, filed May 5, 1987 for S. Jin et al now abandoned) disclosed that some properties of superconductive compound bodies (e.g., their mechanical strength) can be improved by admixture of an appropriate metal powder (e.g., Ag) to the superconductive powder.

The second approach typically comprises forming a "preform" by introducing a quantity of superconductive compound powder into a tubular normal metal body, reducing the cross section of the preform by, e.g., drawing through a die (or dies) or rolling, until the desired wire or ribbon is produced. The wire or ribbon is then typically wound into a coil or other desired shape, followed by a sintering treatment and, possibly, an oxygen content-optimizing treatment. Two recent U.S. patent applications Ser. No. 036,160, filed Apr. 6, 1987 for S. Jin et al now abandoned, and the above-reference to Ser. No. 046,825, filed May 5, 1987 for S. Jin et al now abandoned) disclose techniques for forming metal-clad high $T_c$ superconductive bodies. Such bodies typically are also relatively porous, and have the relatively low $T_c$ associated with high $T_c$ superconductors produced by ceramic processing techniques.

The third approach to forming superconductive compound bodies comprises depositing a thin layer of the superconductive compound on an appropriate substrate. Deposition can be by any appropriate method, e.g., electron beam evaporation, sputtering, or molecular beam epitaxy. Another recently filed U.S. patent application Ser. No. 126,448, which is a continuation-in-part of application 037,264, filed Apr. 10, 1987 for C. E. Rice now abandoned) discloses that thin superconductive films can be produced by forming a solution on a subtrate, and heat treating the thus formed thin layer. The high $T_c$ compound thin films known to the art are thought to be substantially 100% dense, and at least in isolated instances relatively high critical currents have been observed in such layers.

In view of the fact that technologically significant superconductive wires, ribbons, and other bodies have
- be able to carry relatively high current densities and
- be able to withstand relatively large forces, fabrication methods that can result in high $T_c$ superconductive bodies having improved properties (including higher $J_c$, and, typically, greater strength and thermal conductivity) would be of considerable significance. This application discloses such a method.

DEFINITIONS

The Ba-cuprate system herein is the class of oxides of nominal general formula $Ba_{2-x}M_{1-y}X_{x+y}Cu_3O_{9-\delta}$, where M is one of Y, Eu, or La, and X is one or more optional element different from Ba and M and selected from the elements of atomic number 57-71, Sc, Ca, and Sr. Typically $x+y$ is in the range 0-1 (with Ba and M being at least 50% unsubstituted), and typically $1.5 < \delta < 2.5$. In a particular preferred subclass of the Ba-cuprate system $0 \leq y \leq 0.1$, with the original X being one or more of Ca, Sr, Lu and Sc. For further examples see D. W. Murphy et al, *Physical Review Letters*, Vol. 58(18), pp. 1888-1890 (1987).

A slightly different definition of the Ba-cuprate system that has also been used is based on the general formula $Ba_{2-y}(M_{1-x}M'_x)_{1+y}Cu_3O_{9-\delta}$, where M and M' are chosen from Y, Eu, Nd, Sm, Gd, Dy, Ho, Er, Tm, Yb, Lu, La, Sc, Sr or combinations thereof, with typically $0 \leq x \leq 1$, $0 \leq y \leq 1$, and $1 < \delta < 3$. See, for instance, U.S. patent application Ser. No. 118,497, titled "Method of Producing Metal Oxide Material, and of Producing a Superconductive Body Comprising the Material", filed on Nov. 9, 1987 for S. Jin, M. Robbins, and R. C. Sherwood now abandoned.

The La-cuprate system herein is the class of oxides of nominal general formula $La_{2-x}M_xCuO_{4-\epsilon}$, where M is one or more divalent metals (e.g., Ba, Sr, Ca), and $x \geq 0.05$, and $0 \leq \epsilon \leq 0.5$.

A "normal" metal herein is a metal that does not become superconductive at temperatures of technological interest, typically at temperatures of 2K and above.

A body herein is "relatively dense" if at least a major part of the body has a density that is at least 90% of the theoretical density of the material in the part of the body. Preferably the density in the part of the body is greater than 95 or even 99% of the theoretical density. The theoretical density of $Ba_2YCu_3O_7$ is about 6.4 g/cm$^3$, and the density of sintered $Ba_2YCu_3O_7$ bodies (heat treated to optimize the superconductive properties) typically is no more than about 5.5 g/in$^3$ (about

SUMMARY OF THE INVENTION

We have discovered that superconductive compound (e.g., Ba-cuprate and La-cuprate) bodies can be produced by a process that comprises melting a quantity of precursor material, and cooling at least a portion of the melt such that a solid body of a desired shape (e.g., a filament) results, with at least a substantial portion of the superconductive body having a density greater than about 90% of the theoretical density of the superconductive compound. The inventive method typically further comprises heat treating the solid body in an oxygen-containing atmosphere so as to impart the desired superconductive properties to the body. For instance, at least for an exemplary member of the Ba-cuprate system (nominal composition $Ba_2YCu_3O_7$) an appropriate exemplary heat treatment comprises maintaining the body at a temperature in the approximate range 850°-950° C. in an oxygen-containing atmosphere for a period of time in the range 1-48 hours, followed by slow cooling. Although not a requirement, in many cases it will be desirable for the inventive method to be carried out such that the resulting body consists substantially of single phase material.

The inventive technique represents a complete departure from prior art processing of bulk Ba-cuprate and La-cuprate material. These materials, which are ceramics, have in the past been processed by ceramic techniques. In general, ceramic processing techniques do involve high temperature treatment (e.g., sintering). However, standard high temperature processing of ceramic materials is carried out at temperatures below the melting point of the material, and melting of ceramic material is, to the best of our knowledge, not used in the production of any commercially significant ceramic.

All the currently known high $T_c$ ceramic superconductive compounds are either La-cuprates or Ba-cuprates. Both these systems have complicated phase diagrams, with single phase-based superconductivity occurring only in relatively narrow compositional ranges. Due to these circumstances conventional theory suggests that solidification of material from a melt of composition corresponding to that of the superconductive phase will result in decomposition into a multiphase material that is not superconductive, or only partly superconductive at "high" temperatures (e.g., at or above 77K).

Thus, not only is processing that involves melting of the ceramic material not within the normal repertoire of ceramicists but, based on the phase diagram of the prototypical Ba-cuprate $YBa_2Cu_3O_{9-\delta}$), a man skilled in the art has good reason for not melt-processing the material.

However, we have made the unexpected discovery that it is possible to produce superconductive material by a method that comprises cooling from the single phase liquid region (exemplarily sufficiently rapid cooling such that phase separation is substantially avoided or minimized), or that comprises cooling from the solid + liquid region of the phase diagram.

After solidification of the melt a variety of treatments may be applied. For instance, the sample can be maintained in $O_2$ at a temperature between the solidus and that of any solid state transformation (if such a transformation exists) for a relatively long period (e.g., 1-24 hrs) to facilitate homogenization and/or grain growth, soaks) in $O_2$ to room temperature. On the other hand, the solidified sample can be cooled slowly (typically in $O_2$) to room temperature, with a later homogenization treatment in $O_2$ at a temperature relatively close to but below the solidus (exemplarily 1-24 hours at 850°-950° C.). Intermediate treatment schedules are also possible.

In a currently preferred embodiment the melt is cooled relatively rapidly (exemplarily within about 1-600 seconds) from the liquid region of the phase diagram to an intermediate temperature slightly below the solid+liquid region (exemplarily 10°-100° C. below the solidus and above any solid state phase transition temperature that may be present in the system), followed by a heat treatment that favors the growth of crystallites of the superconductive phase and avoids thermal shock and the consequent formation of microcracks. If the cooling from the melt is carried out too slowly (e.g., within more than about 10 minutes) an unacceptable amount of phase separation (typically more than about 15% by volume of non-superconductive phase) is likely to occur, and if the cooling is carried out too quickly (e.g., within less than about 1 second), microcracks may form. The details obviously will depend, inter alia, on the amount and shape of the material that is to be solidified. The heat treatment of the solidified material exemplarily comprises a slow cool (e.g., furnace cool, 1-100 hours) in $O_2$ to about room temperature, and optionally comprises a soak in $O_2$ at the intermediate temperature, or some other elevated temperature. Exemplarily, a melt of composition $YBa_2Cu_3O_x$ ($x \sim 7$) is maintained under $O_2$ at about 1300° C. for about 5 minutes, the melt is then rapidly cooled in $O_2$ to about 950° C., followed by a furnace cool in $O_2$ to room temperature. The resulting material typically has spherulitic microstructure, with many grains being oblong, having a long axis of about 20-200 $\mu m$. The material typically is substantially single phase, essentially 100% dense, and has $T_c$ of about 92K and $J_c$ of more than about 2000 A/cm$^2$ (at 77K, with H=O).

In a further exemplary embodiment the material is heated to a temperature in the solid+liquid region of the phase diagram, optionally maintained in that region under $O_2$ for a period sufficient to result in establishment of approximate phase equilibrium (e.g., 5 second-5 hours), followed by a relatively slow cool (e.g., furnace cool 1-24 hours) in $O_2$ to about room temperature (with an optional soak or soaks at one or more temperatures below the solidus not excluded). Exemplarily, a melt of composition $YBa_2Cu_3O_x$ is maintained at 1030° C. for about 1 hour and furnace cooled. The resulting material typically has predominantly spherulitic microstructure, comprises, in addition to the superconducting phase, crystallites of nominal composition $Y_2BaCu_3O_5$ and also copper oxide and barium oxide. The material typically is essentially 100% dense, and has exemplarily $T_c$ of about 92K and $J_c$ of about 1700 A/cm$^2$ (at 77K, with H=O).

As is apparent from the above cited properties, superconductive bulk samples produced according to the invention can have higher $J_c$ (including substantially greater $J_c$ in a magnetic field) than prior art bodies. Furthermore, bodies produced according to the invention typically also can have greater mechanical strength and greater thermal conductivity.

The known superconductive oxides are relatively reactive and can be expected to interact with most common crucible materials. Consequently, it may be advantageous to use a crucible-free method of melting of the starting material, or to melt the starting material in a crucible that provides a particular constituent to a starting material that is initially deficient in that constituent. For instance, Y-poor Ba-Y-Cu oxide starting material can be melted in a $Y_2O_3$-lined crucible, with the starting composition, melt temperature, soak time, etc. chosen such that the solidified material has the desired 1:2:3 ratio of Y:Ba:Cu.

The inventive method, or obvious variations thereof, can be used in conjunction with the known superconductive compounds, namely, the members of the Ba-cuprate system and of the La-cuprate system. There have been reports that, for instance, in some samples of nominal composition $Ba_2Y_1Cu_3O_{6.9}$ indications of superconductivity were detected at temperatures above 100K. If these reports are correct, then it is likely that an unidentified phase of the material becomes superconductive at a temperature above 100K. We consider it likely that the inventive method, or an appropriate extension thereof, could be used to produce superconductive bodies that comprise the alleged high $T_c$ phase, should the phase exist. Furthermore, the inventive method, or an appropriate extension thereof may even likely be useful in connection with making superconductive bodies from non-cuprate superconductive compounds (e.g., nitrides, sulfides, hydrides, carbides, fluorides, and chlorides), should such non-cuprate superconductive compounds exist. However, in the remainder of this application we will generally only refer to cuprate superconductors, in particular, to the Ba-cuprate of nominal composition $YBa_2Cu_3O_7$. This is for ease of exposition only, and does not imply a limitation of the inventive method to that system.

DETAILED DESCRIPTION OF SOME EMBODIMENTS

Figure 1:
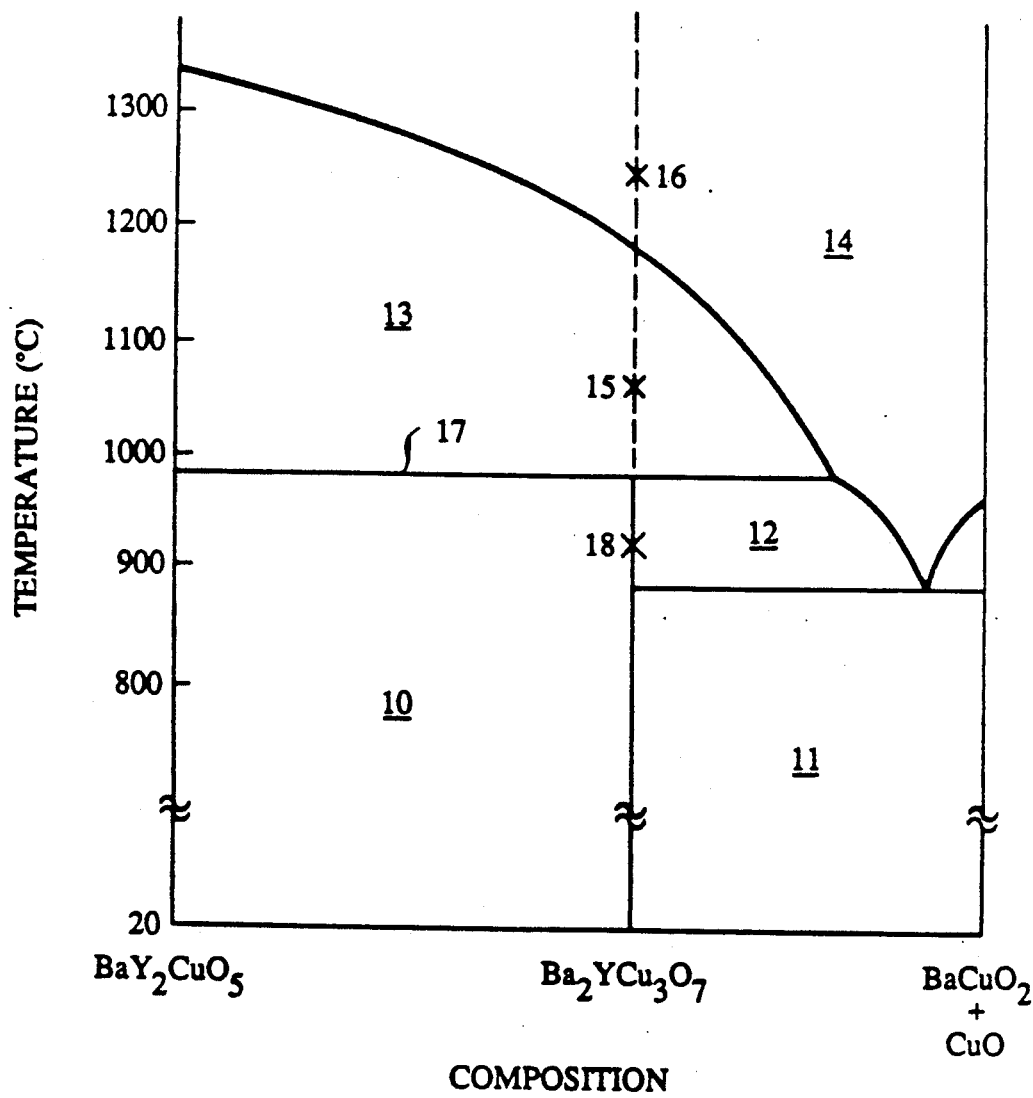
FIG. 1 is a schematic phase diagram, depicting a cross section of a tentative ternary phase diagram of the $Y_2O_3$-BaO-CuO system.

Tentative ternary phase diagrams of the $Y_2O_3$-BaO-CuO system have recently been reported. See, for instance, K. G. Frase et al, "Phase Compatibilities in the System $Y_2O_3$-BaO-CuO at 950° C.," submitted Apr. 7, 1987 to Communications of the American Ceramic Society. FIG. 1 shows a tentative partial schematic phase diagram, derived from the above-referred to ternary phase diagram, that illustrates some aspects of the invention. As will be understood by those skilled in the art, the phase diagram is a schematic cross section of the ternary diagram along the tie-line of non-superconducting $BaY_2CuO_5$ and superconducting $Ba_2YCu_3O_7$. It will also be appreciated that further research may require modification of the phase diagram.

Compositions in fields 10, 11 and 12 of FIG. 1 are mixed solid phases (consisting of $BaY_2CuO_5/Ba_2YCu_3O_7$ and $Ba_2YCu_3O_7/BaCuO_2/CuO$, respectively. Compositions in field 13 are liquid+solid (the solid being $BaY_2CuO_5$). Finally, compositions in field 14 are single phase liquid. As is well known, the presently known high $T_c$ superconductive phase in the Ba-Y-Cu-O system has nominal composition $Ba_2YCu_3O_7$. (The optimal oxygen content is not necessarily equal to 7 but may differ slightly therefrom, e.g., 6.9. We intend to include such minor departures within the above nominal composition.)

Heating a sample of material of composition $Ba_2YCu_3O_7$ above the solidus line 17 (about 980° C. in air or about 1010° C. in oxygen) results in (partial or complete) melting. For instance, if the sample is heated to a temperature in field 13 of FIG. 1 (e.g., corresponding to point 15) then partial melting occurs, with the equilibrium compositions of the liquid and solid portions determined by the familiar lever rule. On the other hand, the equilibrium phase in filed 14 of FIG. 1 is a uniform liquid. However, relatively slow heating through field 13 produces enrichment of the solid phase with Y, with attendant undesirable increase in the melting temperature. Consequently, in at least some of the embodiments of the invention it is considered advantageous to raise the temperature of the starting material relatively rapidly at least through field 13 to a temperature in field 14 (e.g., point 16). Exemplarily, the temperature is raised such that a sample of Ba-cuprate spends less than about 5 minutes (preferably less than 2 or even 0.5 minutes) in field 13 (or an equivalent solid-liquid region of an applicable phase diagram). In some cases it may be advantageous to permit establishment of thermal equilibrium by soaking the sample at a temperature close to but below the solidus, followed by rapid heating to the liquid region.

After being maintained in region 14 for a relatively non-critical period (typically long enough to ensure homogeneity of the melt and short enough to avoid undesired uptake [or possibly loss] of material by [from] the melt) at least a portion of the melt is rapidly cooled through field 13 (or an equivalent solid+liquid region of an applicable phase diagram) to a temperature (e.g., 18) below the solidus but above the orthorhombic/tetragonal transition temperature of $YBa_2Cu_3O_x$ at about 700° C. The cooling rate should be such that phase separation is substantially avoided or minimized. Exemplarily, the cooling rate through field 13 for a sample of Ba-cuprate is typically greater than about 100° C./min, and preferably greater than 200° C./min.

In many cases, it will be desirable to alter the shape of all or part of the molten material prior to its solidification, e.g., by drawing a fiber or a ribbon from the melt, by casting into a mold, or by extrusion through a die. The details of the shaping step as well as of the rapid cooling step depend, inter alia, on the desired shape of the superconductive body. For instance, a fiber or ribbon may be drawn or extruded by techniques of the type employed in the manufacture of optical fibers or of rapidly quenched glassy metals. The casting of bulk bodies will typically require cooling of the mold or die. The shape of the solidified body need not necessarily be the final shape of the superconductor, and at least in some cases it may be advantageous to carry out a separate solid state shaping step, e.g., hot forming at a temperature close to the solidus.

Although currently not preferred, it may at times be advantageous to carry out the shaping of the superconductive material under conditions such that the material is in the solid+liquid region (field 13 of FIG. 1). In particular, the conditions can be chosen such that the solid+liquid mixture has an appropriate viscosity that allows easier shaping of the material. As will be readily appreciated, the processing time in the solid+liquid two phase region advantageously is kept to a minimum (exemplarily less than 10 minutes, preferably less than 1 minute) to reduce compositional separation. As discussed above, subsequent heat treatment should produce substantial homogenization.

Subsequent to the shaping and rapid solidification the body is typically heat treated so as to obtain material of the appropriate composition (e.g., oxygen content) and crystal structure and, possibly, to homogenize the material. Exemplarily, bodies made from the currently preferred Ba-cuprate (nominally composition $Ba_2YCu_3O_{6.9}$) can optionally be heat treated in oxygen (or an oxygen-containing atmosphere such as air) at a temperature in the range 850°–950° C. for a period in range 1–48 hours, typically followed by relatively slow cooling (e.g., average rate $< 100°$ C./hour) in oxygen (or an oxygen-containing atmosphere to a temperature below about 300° C., so as to avoid formation of microcracks. Maintaining the sample at an intermediate temperature for some period (e.g., 10 minutes to 15 hours) may at times be advantageous, e.g., to facilitate attainment of the optimal oxygen content.

As will be appreciated, the details of the heat treatment will depend, inter alia, on the shape of the body. For instance, resolidified bodies having one or two relatively small dimensions (e.g., ribbons and fiber, respectively) may not require as extended post-solidification heat treatment as bulk bodies, since the diffusion distances (e.g., for $O_2$) are much smaller in the former cases than in the latter. Thus, it may be possible to carry out the heat treatment of fiber and/or ribbon as a continuous in-line process right after formation of the fiber or ribbon.

Figure 5:
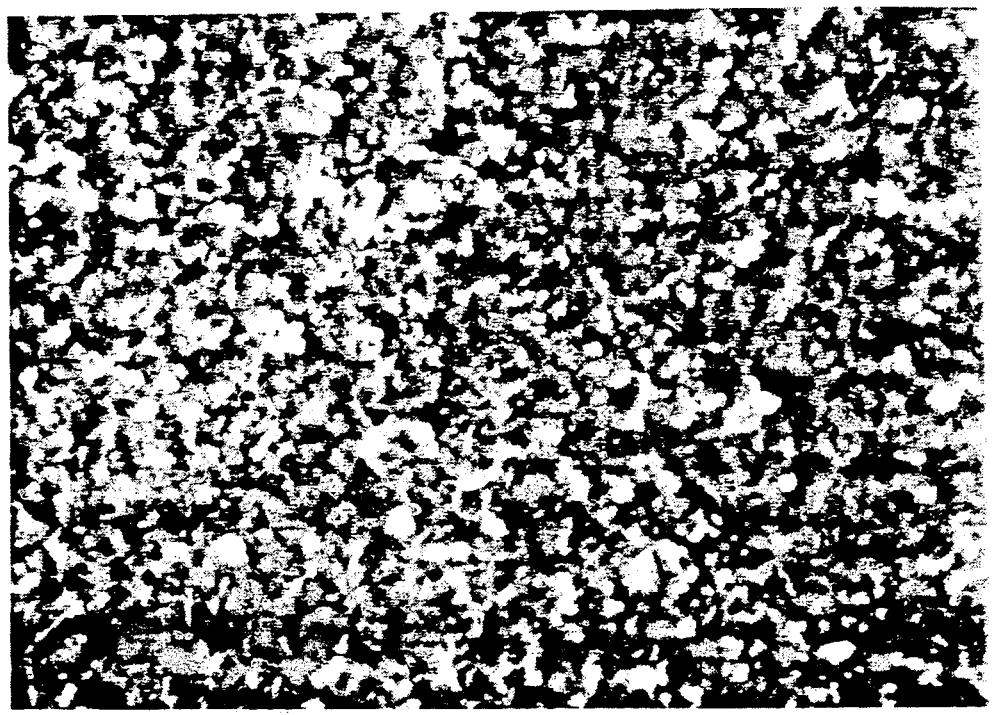
FIGS. 5 and 6 show photomicrographs of a superconductor prepared by the prior art technique and prepared according to the invention, respectively.
Figure 6:
Figure 7:
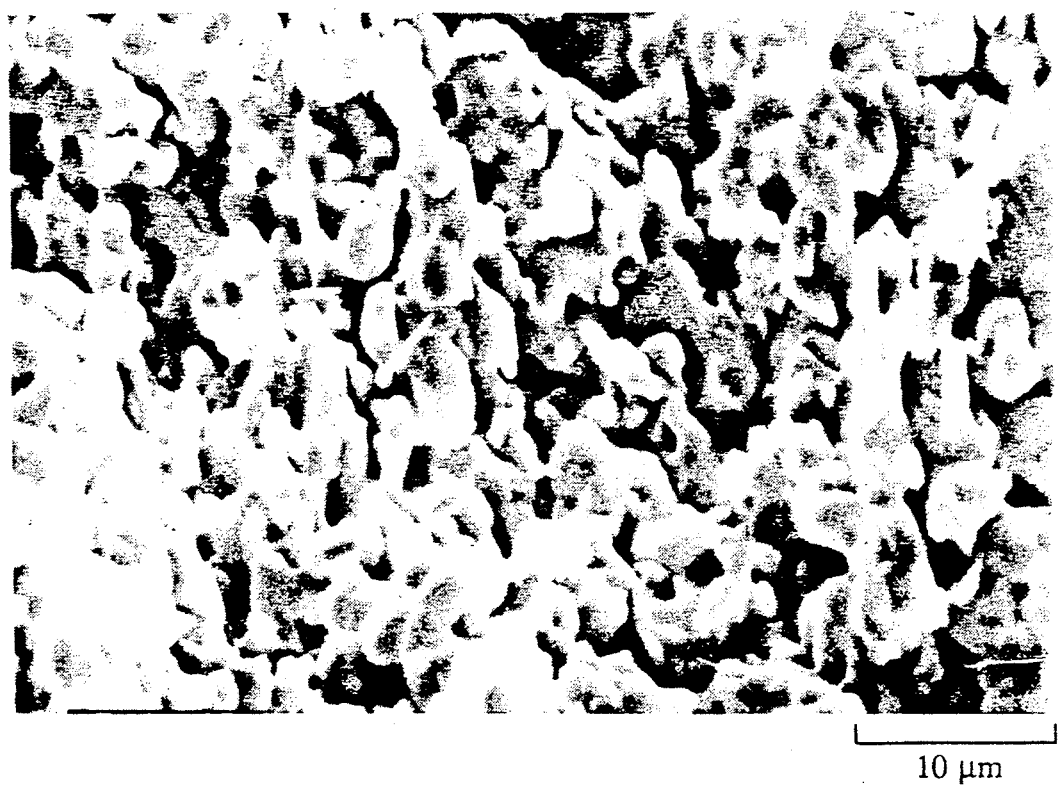
FIGS. 7 and 8 similarly show a scanning electron fractograph of prior art superconductive material and material prepared according to the invention, respectively.
Figure 8:

FIGS. 5 and 7 show a photomicrograph and a scanning electron fractograph of prior art sintered ceramic high $T_c$ superconductive material (nominal composition $YBa_2Cu_3O_{6.9}$, having $T_c$ of about 92K and $J_c$ of about 700 A/cm$^2$ at 77K and H=0). As can be seen from the Figures, the prior art material is granular (average grain size substantially less than 10 μm) and porous, essentially without texture. FIGS. 6 and 8 show a corresponding micrograph and fractograph, respectively, of superconductive material produced according to the invention. The nominal composition of the material of FIGS. 6 and 8 is the same as that of the sintered material of FIGS. 5 and 7. The inventive material also has $T_c$ of about 92K but has $J_c$ of about 3000 A/cm$^2$ at 77K and H=0. The material according to the invention was produced by a process that comprises rapidly (within less than about 5 seconds) cooling the melt from about 1300° C. to about 950° C., followed by a furnace cool to room temperature. As can be seen from FIGS. 6 and 8, the inventive process results in essentially 100% dense material that is strongly textured, with a substantial portion being relatively large elongate crystallites (e.g., having a long dimension that is typically greater than about 10 μm, with aspect ratio typically 10:1 or greater, and with the long axis tending to lie in the basal plane of the orthorhombic superconductor), and that is predominantly single phase. The texture of the exemplary material is spherulitic. However, by providing for directional cooling macroscopically oriented growth can be obtained. Oriented growth (including spherulitic growth) typically results in a structure in which neighboring crystallites have similar orientations, with relatively low angle boundaries between adjacent crystallites. This is considered to be of significance in this layered material which has anisotropic superconductivity and thermal expansion, and may be an aspect that contributes to the improved $J_c$ of material produced according to the invention, as compared to prior art sintered material.

Figure 9:
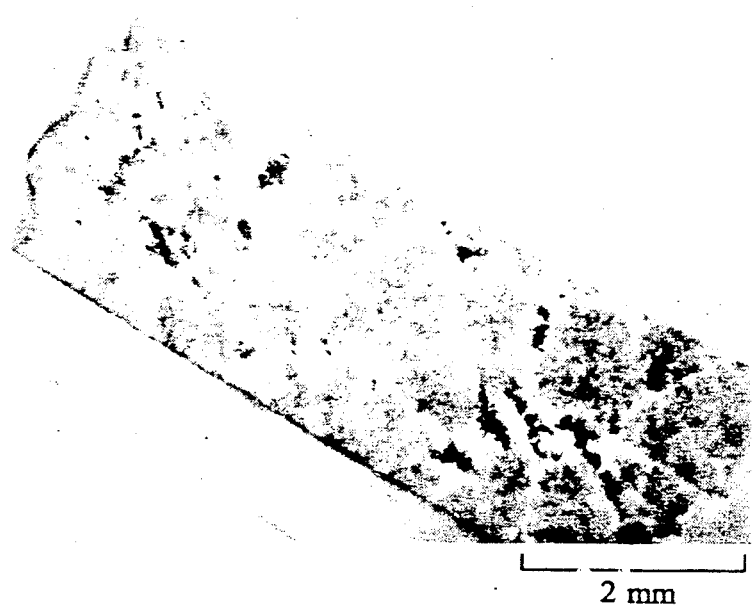
FIGS. 9, 10 and 11 show a low magnification photomicrograph and two high magnification micrographs, respectively, of a further superconductive sample according to the invention.
Figure 10:
Figure 11:
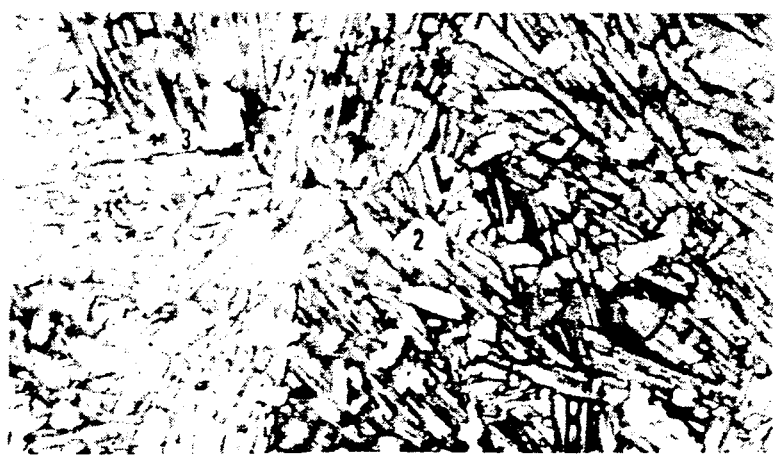

A further embodiment of the inventive method is exemplified by FIGS. 9, 10 and 11, which show respectively a low and two high magnification photomicrographs of high $T_c$ superconductive material produced according to the invention. The material was produced by maintaining a pressed and sintered sample of the starting material (powder of composition $YBa_2Cu_3O_x$) in the solid+liquid region (13 of FIG. 1) of the phase diagram (1 hour at 1030° C.), followed by a furnace cool to room temperature, all under $O_2$. The resulting material had $T_c$ of about 92K, and $J_c$ of about 1700 A/cm² at 77K and H=0.

In FIGS. 10 and 11 the needle-shaped crystallites are superconductive $YBa_2Cu_3O_7$, the rounded crystallites are non-superconducting $Y_2BaCuO_5$, and the bright phase is non-superconducting $CuO(+BaO)$. The material thus is clearly not single phase (although more than 80% by volume typically is superconductive material), but the superconductive phase typically forms a continuous network. As FIG. 9 shows, the non-superconductive "bright" phase is non-homogeneously distributed, being concentrated mainly in thin regions between relatively large regions that are relatively free of the bright phase. FIG. 10 depicts a region that includes a "boundary" between two of the referred to large regions of FIG. 9, and FIG. 11 depicts a portion of the interior of one of the large regions.

Figure 12:
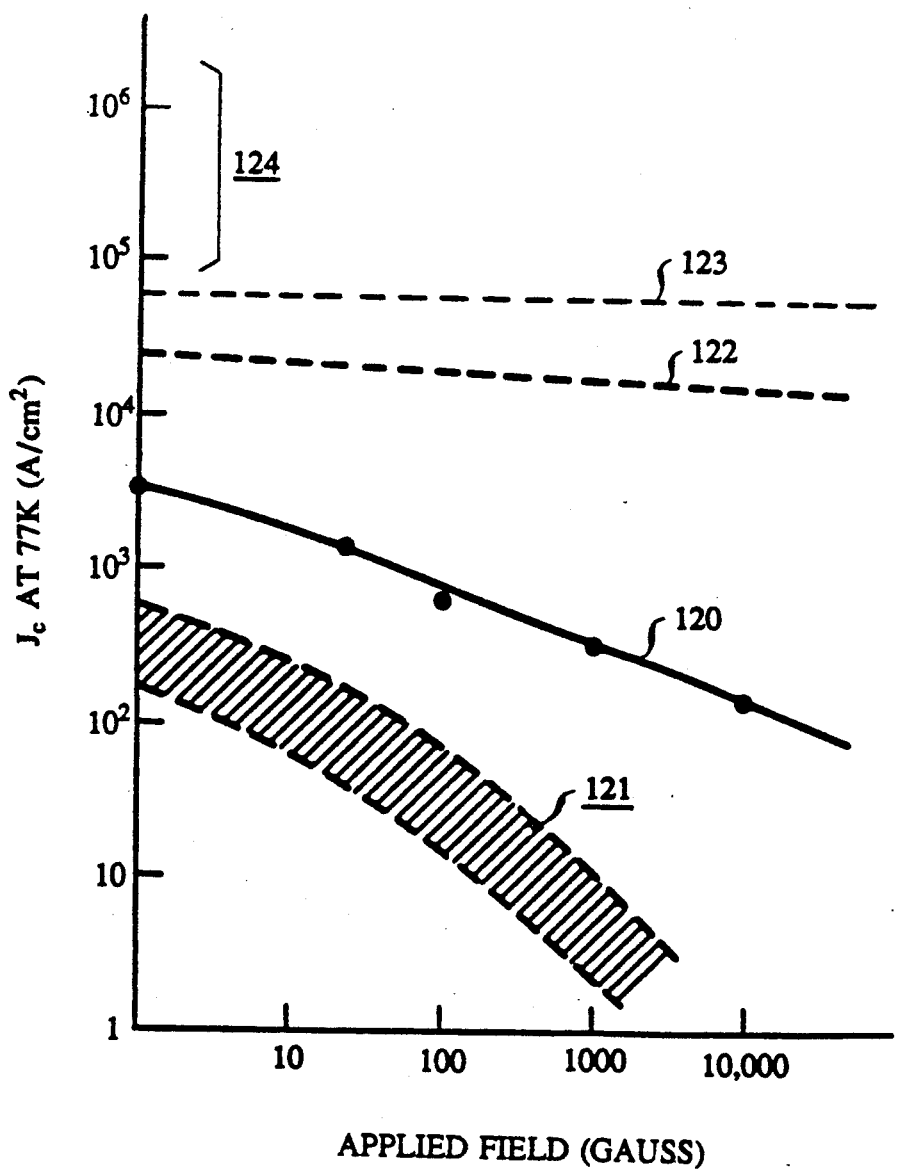
FIG. 12 represents a collection of data on $J_c$ as a function of magnetic field, for $YBa_2Cu_3O_{9-\delta}$ in a variety of (prior art) forms, and also produced according to the invention.

FIG. 12 gives exemplary data of critical current density as a function of applied magnetic field, for samples of nominal composition $YBa_2Cu_3O_7$ produced by a variety of techniques. Line 120 represents bulk samples produced according to the invention. Prior art bulk samples (i.e., sintered) typically fall into region 121. The improvement in $J_c$, including the slower decrease of $J_c$ with increasing magnetic field, is apparent from a comparison of 120 and 121. Line 122 pertains to single crystal samples. Line 123 pertains to thin film results. Further thin films have been found to have $J_c(H=0)$ in the region indicated by bracket 124.

As FIG. 12 demonstrates, there exists a very large difference in $J_c$ between polycrystalline bulk samples (especially prior art material, i.e., material with randomly oriented small grains) and single crystals and thin films. It is widely believed that this difference is due, at least in significant part, to grain boundary resistance effects. Such effects could be caused, inter alia, by the presence of inhomogeneities or impurities, mechanical defects (e.g., stress concentration or microcracks), altered stoichiometry (e.g., oxygen content), structural deviation, or crystal orientation change at grain boundaries. The presence of voids may also adversely affect the transport properties. These and/or possibly other effects are likely to result in low $J_c$ regions at grain boundaries separating high $J_c$ grains. Thus a treatment that eliminates or reduces these low $J_c$ regions or perhaps increases the current carrying capacity of these regions could result in increased $J_c$ of a bulk sample. We believe that the improved $J_c$ observed in samples produced according to the invention is due to such an effect. In particular, the larger grain size and, significantly, the high degree of texture (with the attendant reduction in average orientation change at grain boundaries) are thought to at least contribute to the observed improvement. Other, so far unidentified factors, may of course also be contributing to the improvement.

Figure 2:
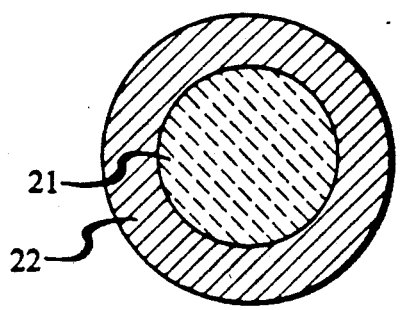
FIG. 2 schematically depicts the cross section of an exemplary wire according to the invention.

The superconductive bodies produced according to the invention may be coated (e.g., for purpose of electrical or thermal stabilization, or mechanical or environmental protection) with a suitable material, e.g., a normal metal such as Ag, Cu, Zn, In, Cd, Al, Sn, etc. The coating can be applied by any suitable process, e.g., by evaporation, or by dipping in the molten metal. The bodies may also be coated with insulating material (e.g., polymers or some oxides), either alone or on top of a metal coating. FIG. 2 schematically depicts in cross section an exemplary coated wire according to the invention, wherein 21 is the melted and resolidified high $T_c$ ceramic superconductive material, and 22 is cladding material, exemplarily a metal cladding.

It is also envisaged to form a "wire" by a process substantially as described in the above referred to U.S. patent application Ser. No. 036,160, now U.S. Pat. Nos. 4,952,554 and 046,825, now abandoned; incorporated herein by reference), except that the cladding material is a relatively ductile high melting point metal such as stainless steel Nb or Ta (including a cladding consisting of ductile high melting point first metal matrix with second metal particles embedded therein, the second metal also having a high melting point and having substantially different chemical behavior than the first metal, such that the second metal particles can be removed by selective etching), with typically a barrier layer on the inside of the cladding. After drawing the wire from a preform and, typically, shaping the wire such that it is at least approximately in its final form, the wire is heated (either all of it simultaneously or consecutively, e.g., by passing a hot zone along the length of wire) such that the oxide powder core of the wire melts, followed by resolidification and heat treatment.

In one exemplary embodiment the cladding is hermetically sealed such that all the $O_2$ that was given off by the oxide during melting and high temperature treatment is still available to re-oxidize the material at lower temperatures. In another exemplary embodiment $O_2$ is pumped into the wire from the wire ends through the voids that resulted from the densification of the oxide material upon melting and resolidification. And in still another exemplary embodiment the wire is made porous by selective etching of the second metal particles, and $O_2$ is supplied to the oxide through the porous cladding during the heat treatment.

The invention can be practiced in a number of ways. For instance, the material that is to be melted (the "charge") can be a sintered body or compressed powder pellet of superconductive oxide produced by a conventional technique, or the charge can be a mixture (in appropriate ratios) of the starting materials for oxide production (e.g., $BaCO_3$, $Y_2O_3$, and CuO powder, or nitrate, acetates, oxalates, etc., containing the desired metals). The composition of the charge can be such that the relevant metals (e.g., Y, Ba, and Cu) are present in the same ratio as they are found in the relative superconductive phase (e.g., 1:2:3), or the melt can be deficient in one (or more) of the metals, with the deficient metal(s) to be augmented in the melt. For instance, Y-deficient starting materials can be melted in a $Y_2O_3$-lined crucible, with Y being augmented from the crucible liner. Such a procedure typically will reduce the likelihood of poisoning of the melt. Furthermore, material once melted according to the invention can be remelted, for instance, to facilitate further shaping or to eliminate trapped bubbles and/or other inhomogeneities. In some instances it may be advantageous to heat the charge slowly to a temperature below the liquidus (or to maintain the charge at that temperature for some period), followed by rapid heating into (and preferably through) the solid +liquid region. Such treatment may reduce oxygen evolution in the liquid material.

Figure 3:
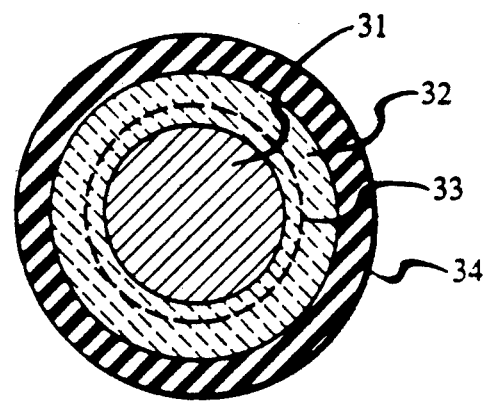
FIG. 3 schematically shows a further exemplary embodiment of the invention.

The charge can be melted in a crucible, contact-free (e.g., by torch, RF, electrical heater, or laser melting the end or middle of a suspended rod of the starting material), or such that the molten charge is in contact only with other charge material (e.g., by forming a molten puddle in a quantity of the starting material). Furthermore, a core of a first material (e.g., silver wire) can be coated with superconductive material (e.g., $Ba_2YCu_3O_7$ powder mixed with a binder, and possibly also with a metal powder such as Ag powder; the presence of the latter can improve the adhesion of the ceramic to the metal core. See the above referred to U.S. patent application Ser. No. 046,825 now abandoned). The coated core is then moved through a heating zone such that the binder is driven off and at least the outer portion of the superconductive material coating is melted and rapidly resolidified, without substantial melting of the first material core. This can be accomplished by a variety of techniques, such as by means of circumferentially arranged lasers or electron beams, by means of a well controlled ring burner, or by microwave heating. FIG. 3 schematically depicts, in cross-sectional view, an exemplary body of the above described type, wherein 31 is the core (e.g., silver wire), 32 is the ceramic superconductive shell, with material outside of line 33 being resolidified (relatively dense) material, and material inside of 33 being less dense material, for instance, being in the sintered state. Layer 34 is a coating (exemplarily a polymer coating). It will be appreciated that 32 could in principle be completely resolidified superconductive material. The invention can also be practiced by forming a layer of precursor material (e.g., a $YBa_2Cu_3O_7$ layer produced by a prior art technique) on a substrate (e.g., $ZrO_2$), melting all or a portion of the precursor material, rapidly cooling the melted material below the solidus, followed by an appropriate heat treatment. The melting can be carried out by any appropriate means, including laser melting or by means of a heat lamp.

Another exemplary embodiment of the invention comprises casting superconductive slit lamellae of the type used in Bitter magnets, assembling a stack of lamellae, with appropriate insulator material between neighboring lamellae and with the lamellae arranged that any given lamella overlaps with its neighboring lamella or lamellae (thereby forming a continuous spiral), melting at least the overlap regions or otherwise establishing superconductive contact between the overlap regions, and heat treating the thus produced Bitter magnet as disclosed herein.

A toroidal superconductive magnet can also be formed by casting of the molten oxide into a tubular mold.

The inventive method typically can be used to fabricate high $T_c$ superconductive bodies that are relatively dense throughout substantially all (typically >95%) of the resolidified portion of the body. Bodies according to the invention typically have substantially greater fracture toughness than less dense identically shaped bodies of the same composition, fabricated by a prior art technique such as sintering of pressed powder. The latter frequently has densities in the range 70-85% of the theoretical density, depending on the heat treatment. The improvement in fracture toughness typically is at least about 50%. Inventive bodies typically also have critical currents that are substantially larger (exemplarily at least about 20% larger) than those of identically shaped prior art superconductive bodies of the same composition. The transition temperature $T_c$ of bodies according to the invention can be identical to that obtainable in prior art bodies of the same composition. Some treatment conditions may lead to a slightly broadened transition, and materials produced according to the invention and having a somewhat broadened superconductive transition (but still reaching R=0 at or above 77K) are also contemplated.

Figure 4:
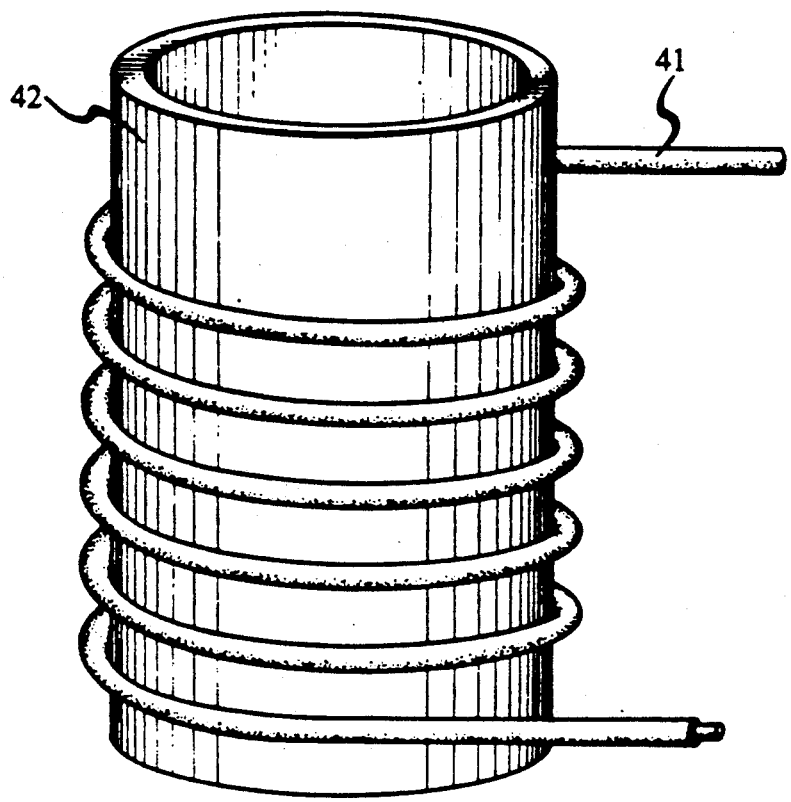
FIG. 4 schematically depicts exemplary apparatus according to the invention, namely, a superconducting solenoid.

Bodies according to the invention can be advantageously employed in a variety of apparatus and systems, e.g., those discussed in the previously referred to books by S. Foner and B. B. Schwartz. Exemplary such of applications is the superconductive solenoid schematically depicted in FIG. 4, wherein 41 is a clad superconductive wire according to the invention, and 42 is a tubular body that supports 41.

EXAMPLE I

Powder of nominal composition $Ba_2YCu_3O_7$ and approximately 5 $\mu m$ average diameter was prepared in a conventional manner (see, for instance, R. J. Cava et al, op. cit.), and pressed into a $3.1 \times 3.1 \times 31$ mm pellet. The pellet was heated such that its central portion melted. Melting and drawing apart of the solid end portions resulted in formation of an elongated neck-down region whose minimum diameter was about 1.25 mm. After rapid solidification of the molten portion the sample was heat treated in oxygen (16 hours at 900° C.; furnace cooled to 600° C.; 2 hours at 600° C.; furnace cooled to 250° C.). The solidified portion of the sample was found to be superconductive, with transition onset temperature of about 98K, and completion (R=0) at 92K. The normalized magnetic susceptibility transition behavior of the resolidified material was essentially the same as that of an unmelted comparison sample of identical composition. In particular, the superconductive transition in both samples was substantially complete at 90K.

EXAMPLE II

Ba-cuprate powder as described in Example I was mixed with 17% by volume of Ag powder (1.3 $\mu m$ average diameter). To the mixture was added 50% b.v. of a commercial acrylic binder (Cladan No. 73140 obtained from Cladan, Inc., San Marcos, Calif.) dissolved in 1,1,1 trichlorethane. A 0.25 mm diameter Ag wire was dipped into the thus produced slurry. The coated wire was heat treated for 16 hours at 900° C. in $O_2$, followed by furnace cooling to room temperature. The resulting wire preform had a diameter of about 0.75 mm, a superconductive transition temperature ($R=0$) of about 92K, and a critical current density of about 100 $A/cm^2$ at 77K. The preform wire was then heated so that at least the outer portion of the ceramic coating was melted rapidly while substantially maintaining the geometry, followed by rapid cooling and resolidification. The wire was then heat treated substantially as described in Example I. The thus produced wire had a substantially 100% dense outer ceramic layer that adhered well to Ag core, $T_c$ ($R=0$) of 91K, and a critical current density of about 400 $A/cm^2$.

EXAMPLE III

A ceramic-coated wire was produced substantially as described in Example II. The wire was then dipped into molten In, resulting in formation of a 0.125 mm thick In coating. The wire was superconducting, with $T_c$ of about 92K.

EXAMPLE IV

A sintered pellet of $Ba_2YCu_3O_7$ powder, produced in the conventional manner, was rapidly heated above the liquidus, and a drop (approximately 6 mm diameter) of the melt caused to fall on a "° inclined steel plate. At the moment of impact the drop was flattened into ribbon shape by dropping a steel block onto it. The contacting surface of the steel block carried a grooved pattern (1.25 mm pitch, 0.375 mm depth). The resulting patterned ribbon was about 0.75 mm thick. The ribbon was heat treated for 16 hours at 900° C., furnace cooled to 600° C., maintained for 2 hours at 600° C., then furnace cooled to 200° C., all in $O_2$. The resulting ribbon had $T_c$ ($R=0$) of about 92K, and $J_c$ of about 200 $A/cm^2$ at 77K. It was substantialy 100% dense, appeared to be essentially single phase, and its fracture toughness is at least 50% greater than that of a sintered test body of identical shape and composition.

EXAMPLE V

A rod is produced from $Ba_2YCu_3O_7$ powder by pressing in a conventional manner. The rod is heated such that a puddle of molten material is formed on the upper end of the rod, the melt is contacted with a silver-coated stainless steel bait rod wire, and the bait rod is withdrawn at a rate such that a 0.125 mm diameter fiber of the ceramic compound is continuously formed. The thus formed substantially 100% dense ceramic fiber is wound on a 1 m diameter spool with Ag-coated surface, and heat treated on the spool substantially as described in Example I. The heat treated fiber is coated by drawing it through molten Cd. The coated fiber has $T_c$ of about 93K, and is wound on a tubular mandrel (having 1 m outer diameter), thereby producing a superconducting solenoid,

EXAMPLE VI

A substantially 100% dense ribbon (0.25×1.25 mm cross section) of nominal composition $Ba_2YCu_3O_7$ is formed in continuous manner by melt spinning, i.e., by causing a continuous stream of the molten material to fall onto a spinning ceramic-coated wheel maintained at about 400° C. After heat treatment substantially as described in Example I the ribbon is substantially single phase material and has $T_c$ of about 92K.

EXAMPLE VII

Powder as described in Example I was pressed into a 2×2×30 mm pellet, the single phase pellet heated to 950° C., followed by rapid (about 200° C./min) heating to about 1300° C., and held at that temperature for about 2 minutes. The resulting single phase liquid was then rapidly cooled (about 200° C./min) to about 950° C., held at that temperature for 20 minutes, followed by furnace cooling to room temperature. All of the heat treatment was carried out in $O_2$ at ambient pressure. The sample was then given a homogenization and oxygen adjustment treatment as follows: heated to 920° C., soaked for 16 hours, cooled to 600° C. at 100° C./hour, cooled to below 300° C. at 20° C./hour, all in $O_2$ at ambient pressure. The sample had $T_c$ ($R=0$) of 93K, and $J_c$ (77K) at $H=0$, 50, 100, 200, and 10,000 gauss of 3100, 2300, 1320, 570, and 130 $A/cm^2$, respectively.

A prior art sample of identical composition and geometry (sintered at 920° C. for 16 hours, furnace cooled to room temperature, all in $O_2$) had $T_c$ ($R=0$) of 92K, and $J_c$ (77K) at 0, 50, 200, and 10,000 gauss of 570, 130, 20, and 3 $A/cm^2$, respectively.

EXAMPLE VIII

A pellet as in Example VII was heated to 1030° C., maintained at that temperature for 2 hours, and furnace cooled to room temperature, all in $O_2$. Subsequently, the sample was heated to 920° C., maintained at that temperature for 16 hours, followed by a furnace cool to room temperature, all in $O_2$. The material had $T_c$ ($R=0$) of 93K, and $J_c$ (77K) at 0, 50, 200, and 10,000 gauss of 1700, 1210, 310, and 100 $A/cm^2$, respectively.

EXAMPLE IX

A sample was prepared substantially as in Example VII, except that the pellet was maintained at 1030° C. for only 20 minutes, followed by a rapid cool to 950° C., followed by a furnace cool to room temperature. The sample had $T_c$ ($R=0$) of 91K and $J_c$ (77K) at 0, 200, and 10,000 gauss of 1600, 380, and 120 $A/cm^2$, respectively.

EXAMPLE X

A sample was prepared substantially as described in Example VII, except that the pellet was held at 1300° C. for 5 minutes, then transferred rapidly (about 0.5 seconds) into a 980° C. region of the furnace, and one end of the pellet exposed to a blast of $O_2$, leading to rapid cooling with directional solidification. The sample had $T_c$ ($R=0$) of 92K and $J_c$ (77K, $H=0$) of 7400 $A/cm^2$.

EXAMPLE XI

A 0.075 mm thick film of nominal composition $YBa_2Cu_3O_7$ is formed on a $ZrO_2$ substrate by coating a surface of the substrate with a slurry (containing about 30% by volume binder as in Example II, the remainder being $YBa_2Cu_3O_x$ powder), heating (50° C./hour) the coated substrate to 900° C. to remove the binder, then raising the temperature to 950° C., maintaining it at that temperature for 2 hours, then rapidly (about 500° C./min) heating the precursor material by means of a heat lamp to 1300° C., maintaining this temperature for 10 seconds, then rapidly (200° C./min) cooling the melted precursor material to 950° C. The substrate with the solidified layer thereon is maintained at 950° C. for 1 hour, then is slowly (30° C./hour) cooled to room temperature. All of the heat treatment is carried out in $O_2$ at ambient pressure. The thus produced superconductive film has $T_c$ of 92K, and $J_c$ (H=0) in excess of 1000 A/cm$^2$.

What is claimed is:

1. A method of fabricating a body that comprises a superconductive oxide of nominal composition $Ba_{2-x}M_{1-y}X_{x+y}Cu_3O_{7\pm\delta}$, where M is selected from the group consisting of Y, Eu, La, and combinations thereof, the optional X is different from Ba and M and is selected from the group consisting of the elements of atomic number 57-71, Sc, Ca and Sr, with $0 \leq x+y \leq 1$ and $0 \leq \delta < 0.5$, and with Ba and M being at least 50% unsubstituted, wherein the method comprises (a) providing a quantity of precursor material comprising an oxide of one or more of Ba, Cu, M and X, associated with the precursor material is a phase diagram comprising a solid-liquid region and a liquid region, and a solidus temperature;
   (b) heating the precursor material such that at least a portion thereof is at a temperature above the solidus temperature and is a liquid;
   (c) cooling at least a part of the liquid precursor material to a temperature below the solidus temperature such that re-solidified precursor material results, the rate of cooling selected such that at least a substantial portion of the re-solidified precursor material comprises elongate grains, associated with a given elongate grain being a long axis and an aspect ratio, at least a substantial fraction of the elongate grains measuring at least about 10 μm along the long axis and having an aspect ratio of at least 10:1; and
   (d) heat treating the re-solidified precursor material in an oxygen-containing atmosphere such that the superconductive oxide is produced from the re-solidified precursor material.

2. Method of claim 1, comprising providing a precursor material that has substantially the same composition as the superconductive oxide.

3. Method of claim 1, comprising providing a precursor material that is deficient in at least one chemical element, as compared to the superconductive oxide.

4. Method of claim 1, comprising carrying out (b) such that a single phase melt is formed.

5. Method of claim 4, wherein (c) comprises cooling the liquid precursor material through the relevant solid+liquid region of the relevant phase diagram, such that compositional variations in the superconducting oxide are minimized.

6. Method of claim 5, comprising providing a precursor material that contains Ba, Y, and Cu, wherein (d) comprises cooling the re-solidified precursor material such that the formation of microcracks is minimized.

7. Method of claim 6, wherein (d) further comprises reheating the re-solidified precursor material to a temperature in the approximate range 850°-950° C., maintaining it within that range for a period in the range 1-48 hours, and cooling the solid body to about room temperature.

8. Method of claim 1, wherein (b) comprises heating the precursor material to a temperature in the relevant solid+liquid region of the phase diagram, and wherein (d) comprises cooling the re-solidified precursor material to about room temperature, such that the formation of microcracks is minimized.

9. Method of claim 1, comprising providing a quantity of precursor material of nominal composition $Ba_x YCu_xO_x$ (x about 7), heating the precursor material such that at least the liquid portion of the precursor material is at a temperature in the liquid region of the relevant phase diagram, and wherein the superconductive oxide is substantially single phase.

10. Method of claim 1, comprising providing a core member, surrounding the core member with precursor material, and melting at least a portion of the precursor material substantially without melting the core member.

11. Method of claim 10, comprising mixing Ag powder with the precursor material.

12. Method of claim 1, comprising providing a substrate member having a major surface, forming a layer of precursor material on the major surface, and melting at least a portion of the precursor material.

13. Method of claim 1, comprising (i) providing a crucible having a surface formed by a first material that comprises Z where Z is one or more chemical elements from the group consisting of Ba, M, X and Cu; (ii) introducing a quantity of precursor material into the crucible, the precursor material being deficient in Z, as compared to the superconductive oxide; (iii) melting the precursor material such that the liquid precursor material contacts the surface formed by the first material, with some of the first material being consumed and the concentration of Z in the liquid precursor material being thereby increased.

14. Method of claim 1, wherein in any given region of the portion of the material the elongate grains have similar orientation, with the long axis of any given elongate grain pointing in substantially the same direction as the long axes of the elongate grains adjacent to the given grain.

15. The method of claim 1, comprising
   (i) heating the precursor material such that a hot zone results, with at least a portion of the precursor material in the hot zone being a liquid and the precursor material not within the hot zone being solid; and
   (ii) moving the hot zone relative to the quantity of precursor material, whereby directional solidification of the liquid precursor material results.

16. A method of fabricating a body that comprises a superconductive oxide of nominal composition $Ba_{2-x}M_{1-y}X_{x+y}Cu_3O_{7\pm\delta}$, where M is selected from the group consisting of Y, Eu, La, and combinations thereof, the optional X is selected from the group consisting of the elements of atomic number 57-71, Sc, Ca, and Sr, with $0 \leq x+y \leq 1$ and $0 \leq \delta < 0.5$, and with Ba and M being at least 50% unsubstituted; where the method comprises (a) providing a first body comprising a precursor material, the precursor material comprising an oxide of one or more of Ba, Cu, M and X;
   (b) heating the body such that a hot zone results, with at least a portion of the precursor material in the hot zone being a liquid and the precursor material not within the hot zone being solid;
   (c) moving the hot zone relative to the first body, such that directional solidification of liquid precursor material results, the solidification carried out such at least a substantial portion of the solidified precursor material comprises elongate grains, associated with a given elongate grain being a long axis and an aspect ratio, at least a substantial fraction of the elongate grains measuring at least 10 μm along the long axis and having as aspect ratio of at least 10:1; and
   (d) heat treating the first body in an oxygen-containing atmosphere such that the superconductive oxide is produced from the directionally solidified precursor material.

17. The method of claim 16, wherein the first body comprises a core member and a coating, the coating comprising the precursor material, and the first body is moved relative to stationary means for producing the hot zone.

18. A method of fabricating a body that comprises a superconductive oxide of nominal composition $Ba_{2-x}M_{1-y}X_{x+y}Cu_3O_{9-\delta}$, where M is selected from the group consisting of Y, Eu, and La, and X is one or more optional element different from Ba and M and selected from the group consisting of the elements of atomic number 57-71, Sc, Ca, and Sr, with $0 \leq x \leq 1$ and $1.5 < \delta < 2.5$, with Ba and M being at least 50% unsubstituted, associated with the body being a critical current density; wherein the method comprises (a) providing a quantity of precursor material comprising an oxide of one or more of Ba, Cu, M and X, and producing a solid body from the precursor material; and (b) heat treating the solid body in an oxygen-containing atmosphere such that the solid body becomes a superconductive body; wherein the method further comprises (c) heating the precursor material such that at least a portion thereof becomes a liquid; and (d) cooling at least a part of the liquid precursor material such that the solid body results, the process carried out such that the superconducting body has a critical current density that is at least 20% larger than that of a comparison superconducting body of identical shape and composition that is produced by a method that does not involve melting of oxide precursor material.

* * * * *